(12) United States Patent
Nakamura

(10) Patent No.: US 7,476,138 B2
(45) Date of Patent: Jan. 13, 2009

(54) METHOD OF MANUFACTURING ORGANIC EL DISPLAYS INCORPORATING ADHESION ESCAPE GROOVES SURROUNDING AN ADHESION REGION OF EACH DISPLAY

(75) Inventor: Hideyo Nakamura, Minami-Alps (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 440 days.

(21) Appl. No.: 11/436,047

(22) Filed: May 18, 2006

(65) Prior Publication Data

US 2006/0292724 A1  Dec. 28, 2006

(30) Foreign Application Priority Data

Jun. 22, 2005 (JP) ............... 2005-181736

(51) Int. Cl.
  *H01J 9/00* (2006.01)
  *H01L 51/56* (2006.01)
  *H05B 33/00* (2006.01)
(52) U.S. Cl. .......................... 445/25; 445/24
(58) Field of Classification Search ............ 445/24, 445/25; 313/512; 257/40, 98–100
  See application file for complete search history.

(56) References Cited

U.S. PATENT DOCUMENTS 4,275,494 A * 6/1981 Kohyama et al. ........... 445/24
6,855,961 B2 * 2/2005 Maruyama et al. .......... 257/99
2005/0264189 A1 * 12/2005 Choi et al. ............... 313/506
2006/0132033 A1 * 6/2006 Maeda ..................... 313/512

FOREIGN PATENT DOCUMENTS

| JP | 2000-100562 | 4/2000 |
|----|-------------|--------|
| JP | 2001-189191 | 7/2001 |
| JP | 2003297558 A * | 10/2003 |

* cited by examiner

*Primary Examiner*—Mariceli Santiago
(74) *Attorney, Agent, or Firm*—Rabin & Berdo, PC

(57) ABSTRACT

A method of manufacturing a plurality of organic EL displays, by sealing and cutting an organic EL substrate, controlling the adhesion width and cutting the glass substrate without extending the cutting position. An organic EL substrate, and a sealing glass substrate with recesses opposing each laminate of the organic EL substrate, have adhesion regions surrounding each recess, and adhesion escape grooves having a substantially equal depth surrounding each adhesion region. The two substrates are laminated together with an adhesive. The sealing glass substrate is cut at a position outside and within a distance of [(a length equal to a thickness of the sealing glass substrate)−(a length equal to a depth of the adhesive escape groove)] of the inner side-wall of the adhesive escape groove. The organic EL substrate is cut at a position outside the inner side-wall of the adhesive escape groove.

14 Claims, 8 Drawing Sheets

METHOD OF MANUFACTURING ORGANIC EL DISPLAYS INCORPORATING ADHESION ESCAPE GROOVES SURROUNDING AN ADHESION REGION OF EACH DISPLAY

CROSS-REFERENCE TO RELATED APPLICATION

This application is based on, and claims priority from, Japanese Application No. 2005-181736, filed on Jun. 22, 2005, the contents of which are incorporated herein by reference.

BACKGROUND OF THE INVENTION

1. Field of the Invention

The present invention generally relates to a method of manufacturing an organic EL (electroluminescent) display using a sealing glass substrate, and more specifically to a method of manufacturing an organic EL display using a sealing glass substrate provided with an escape groove for adhesive adjacent to an adhesion region.

2. Description of the Related Art

A conventional sealed organic EL display, in the type called a bottom emission type in particular, has a structure as shown in FIGS. 1A-1C. The organic EL display in the sectional view of FIG. 1A comprises a laminate 12 including a transparent electrode, an organic EL layer, a reflection electrode formed on a glass substrate 11, and a lead out terminal 17a connecting electrically to the reflection electrode of the laminate 12. An adhesive 13 is applied around the laminate 12 and adheres the laminate to a sealing glass substrate 14. The organic EL layer, being very vulnerable to oxygen and moisture, easily loses light emission ability upon exposure to the atmosphere. Accordingly, an organic EL layer is usually sealed by a sealing glass substrate 14 having a moisture absorber 15 disposed opposing the laminate 12 in a chamber with extremely reduced oxygen and moisture. To prevent the organic EL layer and other laminated films from being touched, and to ensure that a space is provided for accommodating the moisture absorber, a recess may be created in the sealing substrate in the portion opposing the laminate of the organic EL layer and other films. The adhesive 13 can be formed from an ultraviolet light-hardening type adhesive, for example. FIG. 1B is a plan view of this structure taken from the side of the glass substrate 11. An organic EL display area for light emission from the organic EL layer is formed in the location corresponding to the laminate 12. A sealing region is formed in the area corresponding to the adhesive 13. FIG. 1C is a plan view of this structure taken from the side of the sealing glass substrate 14, in which lead out terminals 17a and 17b are exposed. The lead out terminal 17a electrically connects to the reflection electrode and the lead out terminal 17b electrically connects to the transparent electrode.

Mass production of organic EL displays is generally carried out by forming multiple organic EL display areas on a glass substrate, sealing with a sealing glass substrate, and then cutting those substrates to form multiple organic EL displays. FIG. 2 shows a sealing substrate 21 and a substrate 25 for multiple organic EL displays. The substrate 25 for multiple organic EL displays comprises multiple combinations of a laminate 26 containing a transparent electrode, an organic EL layer, and other layers (which forms an organic EL display area together with a reflection electrode) and a lead out terminal 27 electrically connecting to the reflection electrode in contact with the laminate 26. The sealing substrate 21 has recesses 22 at positions opposing the respective laminates 26. Adhesive is applied around each recess 22 by means of a dispenser or by screen printing and the two substrates are laminated as shown in FIG. 3A-3C. FIG. 3A is a sectional view; FIG. 3B is a plan view taken from the side of the substrate 25 for multiple organic EL displays; and FIG. 3C is a plan view taken from the side of the sealing substrate 21. In the laminating process, the adhesive (ultraviolet light-hardening resin) is pressed by exerting external pressure after the elements are combined, or the elements are combined under a reduced pressure and then the atmospheric pressure is restored. After curing the adhesive by irradiating it with ultraviolet light, the sealing substrate 21 is cut along the lines 32 and the substrate 25 for multiple organic EL displays is cut along the lines 31, to obtain the shape shown in FIG. 1A-1C. The cutting is carried out primarily by means of a scribe method, in which small nicks are formed on the glass surface using a diamond cutter or the like, and then developing the cracks by striking from the back side or exerting a stress, to cleave the glass.

The use of a material other than glass for the sealing substrate has been proposed in Japanese Unexamined Patent Application Publications.2001-189191 and 2000-100562. In the structure of 2001-189191, two grooves are formed at both sides of an adhesion application region of a sealing plate of stainless steel manufactured by drawing control, and expansion of the adhesive is restrained. The sealing plate in this arrangement is, however, not planar and has a shape that is difficult to fabricate in glass. In addition, the adhesive is permitted to expand laterally beyond the grooves and the structure does not take into account the cutting after sealing. Japanese Unexamined Patent Application Publication 2000-100562 discloses a structure that restrains invasion of adhesive into a space for accommodating a light emitting part by disposing a groove on an adhesive application region in a sealing body of metal or the like. The sealing board of this structure is again not planar and difficult to fabricate in glass. The structure restrains invasion of adhesive into a space for accommodating a light emitting part by permitting outward expansion of the adhesive, thus, does not consider cutting work after the sealing.

In the method of manufacturing an organic EL display as shown in FIGS. 1A-1C from the combination of FIGS. 3A-3C, the adhesive may run off from the predetermined location and extend laterally in the process of laminating the two substrates 21 and 25. If the run off adhesive expands to the cutting position, the nick produced fails to cut the glass at the desired position. (See FIG. 6A.) Even if a nick is produced in an area the adhesive exists, the crack does not extend or extends to a direction where the adhesive is absent, generating defects such as cracking, burrs, and flaking. Accordingly, a means is taken in which the cutting position is determined in the outside region from the extended adhesive with enough clearance. Or if some restriction is imposed on the cutting position, the adhesion width is narrowed or the adhesive is not pressed strongly, preventing the adhesive from expanding uncontrollably from the position at which the adhesive is applied.

Control of the expanded width of the adhesive becomes difficult as the degree of squeezing of the adhesive increases and needs excessive space. As a result, a peripheral region of an EL display area called "a picture frame" expands and the external dimension of the display enlarges, decreasing the number of displays that can be produced from one substrate and causing an increase in the cost. The narrowing of adhesion width and the decrease in the amount of squeezing, on the other hand, deteriorate sealing performance and readily cause degradation of the organic EL layer due to oxygen or moisture.

Since the end milling work for forming the recess on the glass substrate generates distortion of several tens of microns in height around the recess, it is difficult to apply adhesive uniformly around the recess. If the application is non-uniform, then uniform pressing still causes different degrees of expansion of the adhesive (adhesion width) from place to place. If a precise application of adhesive is desired on a distorted surface, a costly system would be needed that measures the height of the surface to which the adhesive is to be applied and conducts application of the adhesive strictly following the height.

SUMMARY OF THE INVENTION

Therefore, a problem to be solved by the invention is, in a process of manufacturing a plurality of organic EL displays by sealing and cutting an organic EL substrate having a plurality of organic EL display parts, to achieve a structure that can control adhesion width and facilitate cutting without extending cutting position of glass even with an sufficiently wide adhesion width and an extent of squeezing to an extremely thin thickness of several microns, in the process of laminating a sealing substrate over the organic EL substrate. Such a manufacturing method provides long life organic EL displays at low cost.

To solve the above problem, the present invention provides a sealing glass substrate having an adhesive escape groove surrounding each recess opposing an organic EL display part. The amount of applied adhesive used for pasting is a little more than the amount needed to form a desired width and a thickness and less than the amount needed to completely fill the escape groove. The sealing glass substrate is cut by forming a nick at a position with a predetermined distance from an inner circumference of the adhesive escape groove, and the organic EL substrate is cut at a position outer than the inner circumference of the adhesive escape groove.

When an organic EL substrate and a sealing substrate are combined using an adhesive according to the method of the invention, even if the amount of applied adhesive and the exerted pressing are not uniform, the excess adhesive extends vertically in the adhesive escape groove and does not extend laterally beyond the adhesive escape groove. As a result, a width of the sealing region formed after curing the adhesive is nearly uniform throughout the sealing region. After the curing, since the glass of the sealing substrate is cut at a position within a predetermined distance from the inner circumference of the escape groove, a cut surface free of a mechanically weak protrusion (a burr) is obtained. Since the adhesive stops to extend in the vicinity of the inner circumference of the escape groove, the organic EL substrate can be clearly cut at a position free of the adhesive (at an unadhered position) by providing a nick at location just beyond the extent of the adhesive.

According to the sealing method of the invention, a width of a sealing region can be readily controlled even with a wide adhesion width and a thin adhesion thickness. Therefore, the sealing performance is improved without enlarging a peripheral area of a display. Or, with the same sealing width as a conventional one, the outline dimension of the display can be reduced, thereby increasing the number of organic EL displays that can be produced from one sheet of substrate. Moreover, the process can be carried out using inexpensive application and lamination devices. Since the sealing is also performed efficiently, inexpensive and long life organic EL displays can be obtained.

BRIEF DESCRIPTION OF THE DRAWINGS

FIGS. 1A-1C show an organic EL display manufactured by conventional technology, wherein FIG. 1A is a sectional view, FIG. 1B is a plan view taken from an organic EL substrate side, and FIG. 1C is a plan view taken from a sealing substrate side;

FIGS. 3A-3C illustrate sealing and cutting according to the conventional technology, wherein FIG. 3A is a sectional view, FIG. 3B is a plan view taken from an organic EL substrate side, and FIG. 3C is a plan view taken from a sealing substrate side;

FIGS. 4A-4B show a sealing glass substrate according to the invention, wherein FIG. 4A is a sectional view, and FIG. 4B is a plan view;

FIGS. 5A-5C illustrate sealing and cutting according to the invention, wherein FIG. 5A is a sectional view, FIG. 5B is a plan view taken from an organic EL substrate side, and FIG. 5C is a plan view taken from a sealing substrate side;

FIGS. 6A-6B illustrate extension of the adhesives in a method of conventional technology and in a method of the invention, wherein FIG. 6A is a sectional view in the conventional method, and FIG. 6B is a sectional view in the invented method;

FIGS. 7A-7C show an organic EL display manufactured by a method of the invention, wherein FIG. 7A is a sectional view, FIG. 7B is a plan view taken from an organic EL substrate side, and FIG. 7C is a plan view taken from a sealing substrate side; and FIGS. 8A-8H show variations of the sealing glass substrate used in methods according to the invention, wherein FIGS. 8A-8B illustrate a structure in which adhesive escape grooves are provided at both sides of an adhesion region, FIGS. 8C-8D illustrate a structure in which an adhesive escape groove is partly joined to an adjacent adhesive escape groove, FIGS. 8E-8F show a structure in which outer peripheral sidewalls of adhesive escape grooves have right angle vertexes, and FIGS. 8G-8H illustrate a structure in which all adhesive escape grooves are connected.

DETAILED DESCRIPTION OF THE PREFERRED EMBODIMENTS

Figure 4B:
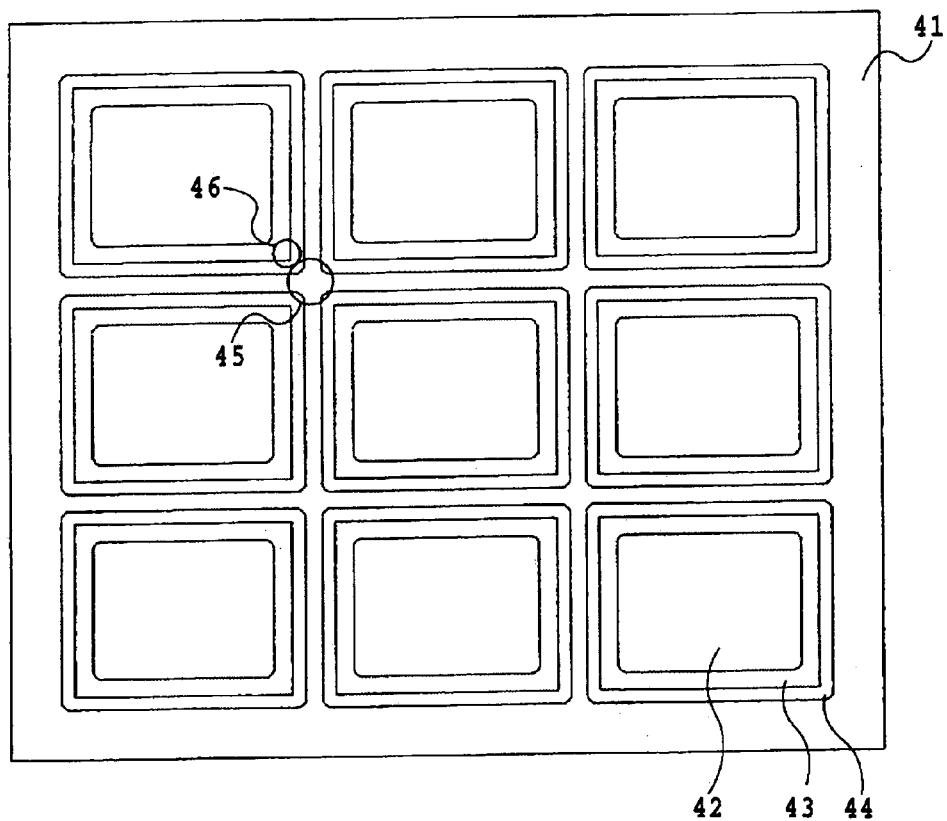
Figure 4A:

FIGS. 4A-4B show a sealing glass substrate 41 used in a manufacturing method according to the invention. FIG. 4A is a sectional view, and FIG. 4B is a plan view taken from the side of the adhesive escape grooves. The sealing glass substrate 41 has a structure for manufacturing a plurality of organic EL displays at one time by combining the sealing glass substrate with an organic EL substrate 53 having a plurality of organic EL laminates and by cutting the combination into the plurality of organic EL displays. The sealing glass substrate 41 is generally formed of a glass plate and comprises recesses 42 each opposing an organic EL laminate, adhesion regions 43 each surrounding a respective recess 42, and adhesive escape grooves 44 each surrounding a respective adhesive region 43. Each adhesive escape groove 44 in this embodiment corresponds to an organic EL laminate in a one-to-one corresponding manner and does not connect to any adhesive escape groove that corresponds to another organic EL laminate, (that is, separately arranged).

The recess 42 is generally rectangular so as to correspond to the shape of the organic EL laminate. Each of the length and breadth of the recess 42 is preferably about 500 μm larger on one side than that of the organic EL laminate. A depth of the recess must be larger than [(a thickness of a moisture absorber)+(a thickness of the organic EL laminate)−(an adhesion thickness)]. Additional allowance is desirable in consideration of distortion in the sealing glass substrate and the tolerance of working accuracy. The depth of the recess is generally in the range of 200 to 500 μm. The adhesion region 43 has preferably a width in the range of 1 to 5 mm depending on the size of the organic EL laminate.

The adhesive escape groove 44 must have a width and depth sufficient to prevent the adhesive to extend beyond the adhesive escape groove 44 during the laminating process. The width of the adhesive escape groove is generally in the range of 0.5 to 2 mm, preferably in the range of 0.75 to 1.5 mm. The depth of the adhesive escape groove 44 is generally in the range of 200 to 500 μm. It is desirable that the adhesive escape groove 44 and the recess 42 have a common depth. It is preferable that the four vertexes 45 of the outer periphery of the adhesive escape groove 44 are rounded. The rounded vertexes 45 ensure maintaining the strength of the sealing glass substrate 41 during the processes of fabricating the recesses 42 and the adhesive escape grooves 44. On the other hand, it is preferable that the four vertexes 46 of the inner periphery of the adhesive escape groove 44 are not rounded but rather are right angle vertexes. The inner periphery of the adhesive escape groove 44 is very close to the position of orthogonal cutting lines in the process of cutting the sealing glass substrate by a scribe method. If the vertexes are rounded, mechanically feeble protrusions (burrs) with a hood-shape could be generated in the cutting process.

Figure 1B:
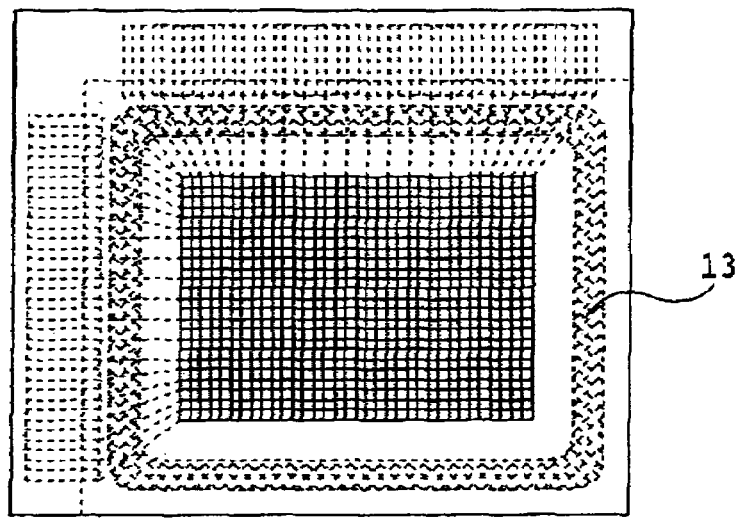
Figure 1A:
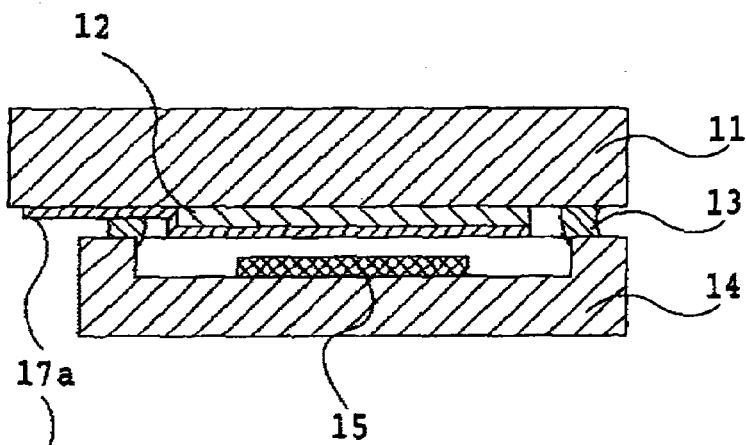
Figure 1C:
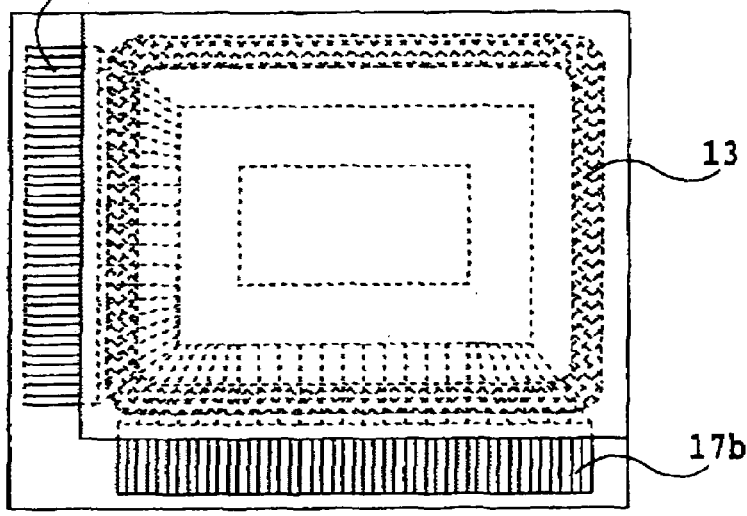
Figure 2:
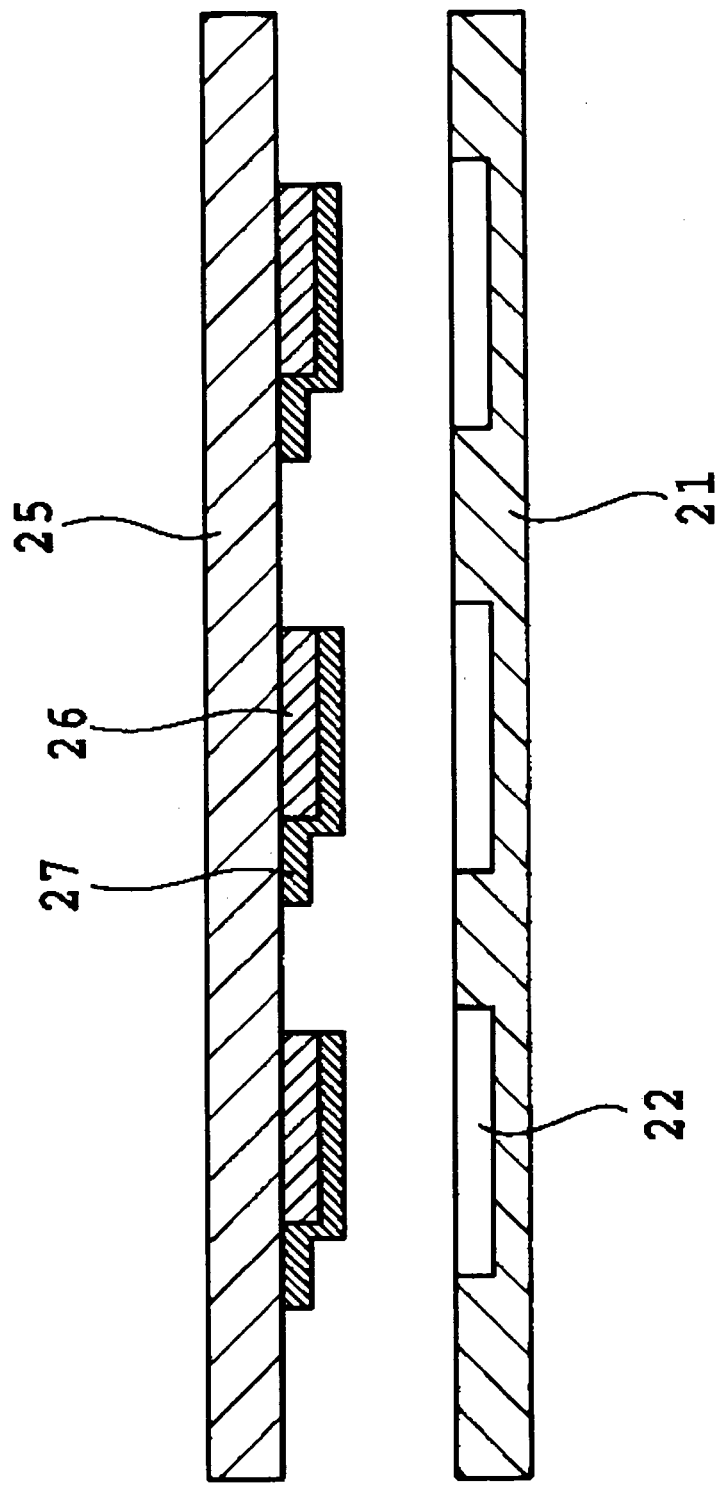
FIG. 2 is a sectional view of an organic EL substrate for multiple organic EL displays and a sealing glass substrate according to a conventional technology.
Figure 3B:
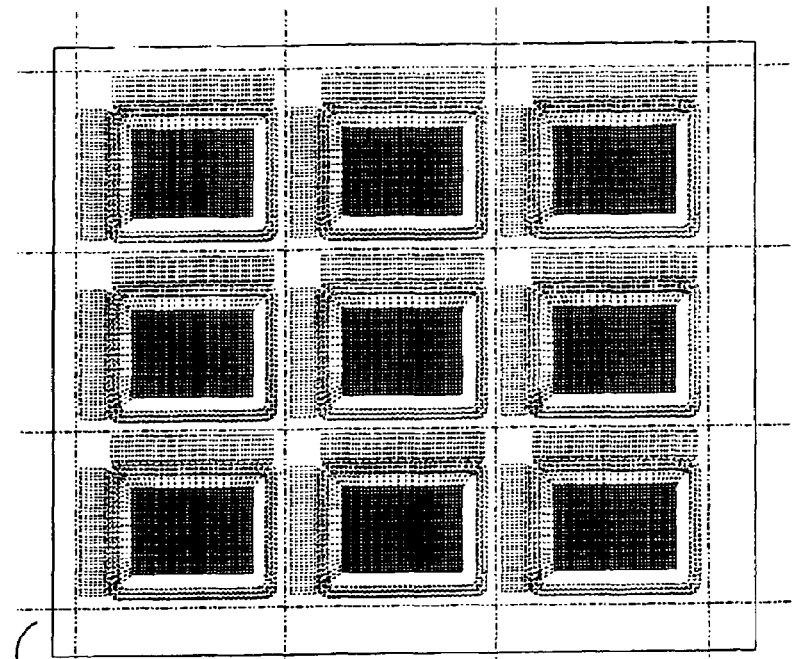
Figure 3A:
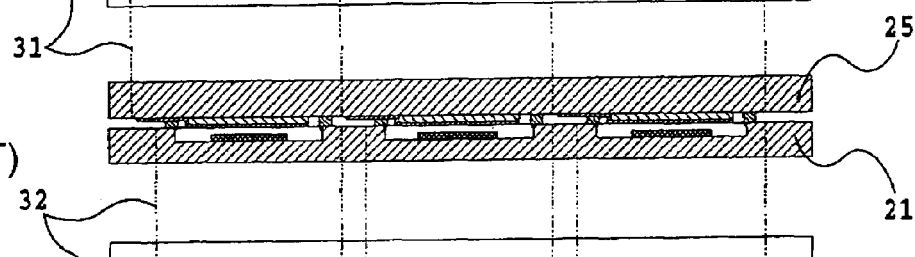
Figure 3C:
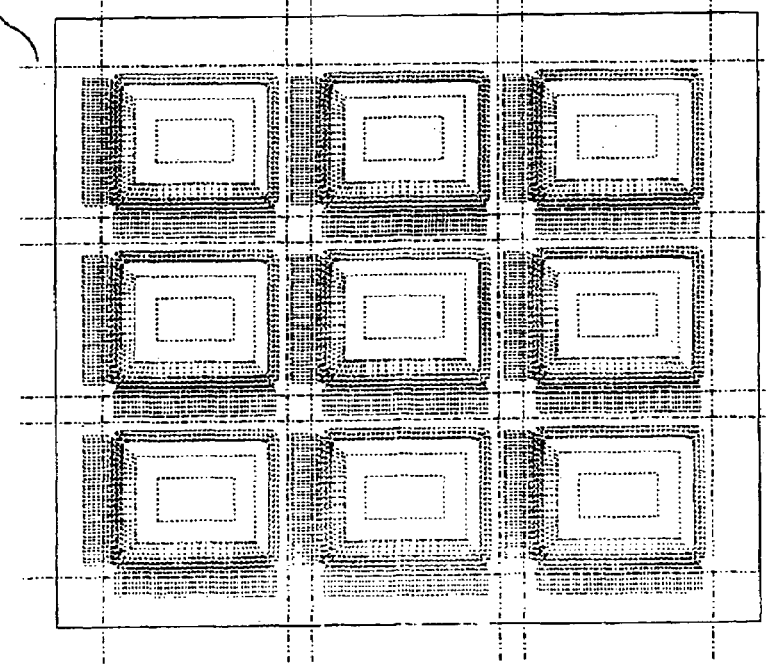

A sealing glass substrate 41 of the invention can be obtained by digging by means of etching or sandblasting to form the recesses 42 and the adhesive escape grooves 44. By employing those methods and a common digging depth in both of the recesses 42 and the adhesive escape grooves 44 in a simultaneous working process, the working costs does not increase as compared with in the working process for a conventional sealing glass substrate (shown in FIG. 2) having recesses alone.

Figure 5B:
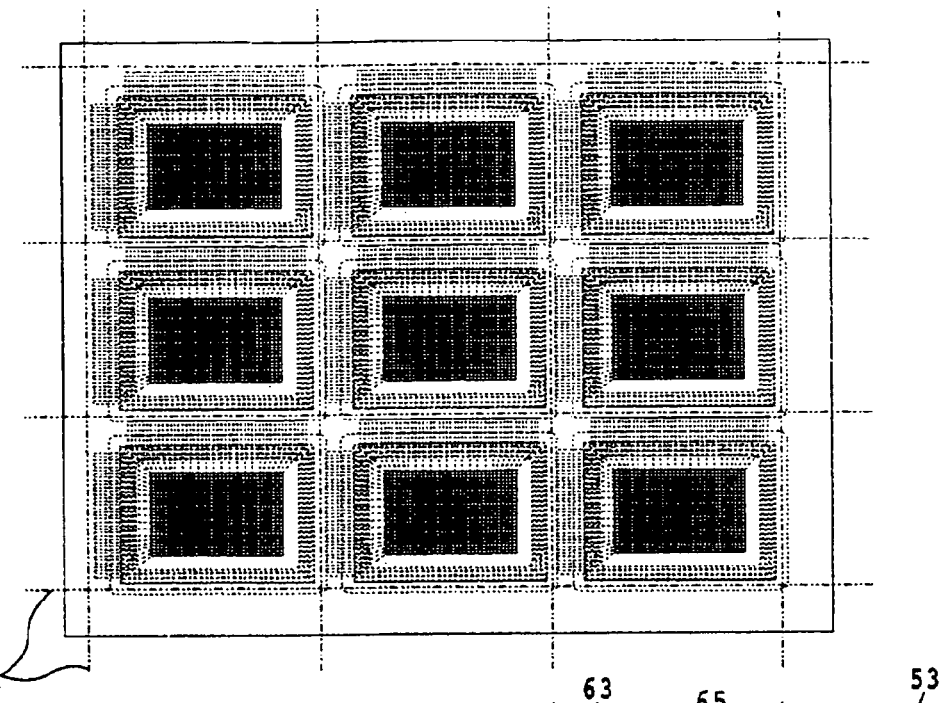
Figure 5A:
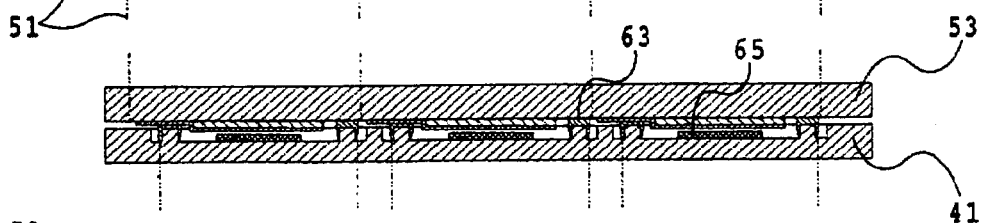
Figure 5C:
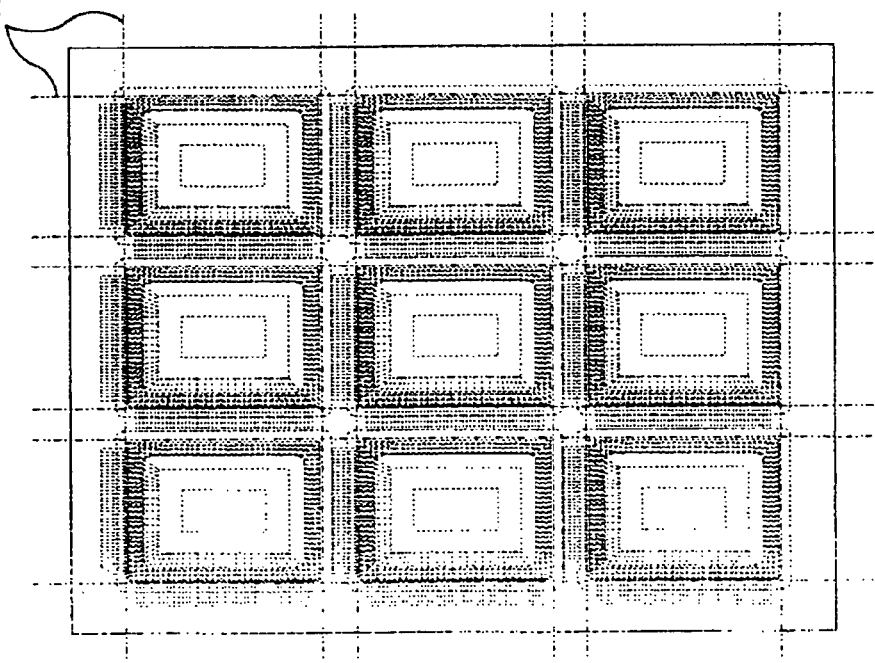

FIGS. 5A-5C illustrate lamination of the sealing glass substrate 41 and the organic EL substrate 53, and the cutting process of the two substrates. FIG. 5A is a sectional view; FIG. 5B is a plan view taken from the side of the organic EL substrate 53; and FIG. 5C is a plan view taken from the side of the sealing glass substrate 41. A moisture absorber 65 can be disposed in the recess 42 of the sealing glass substrate 41. The moisture absorber 65 can be a material known in the art, for example, a package containing calcium oxide With a sealing member. An adhesive 63 is applied on an adhesion region 43 by means of screen printing or using a general-purpose dispenser. The adhesive 63 can be an ultraviolet light-curing type adhesive known in the art. Adhesive containing spacers, for example glass beads with uniform grain size, can be used as necessary. The spacer-containing adhesive is effective to ensure minimum adhesion thickness and to avoid excessive squeezing of the adhesive.

Figure 6A:
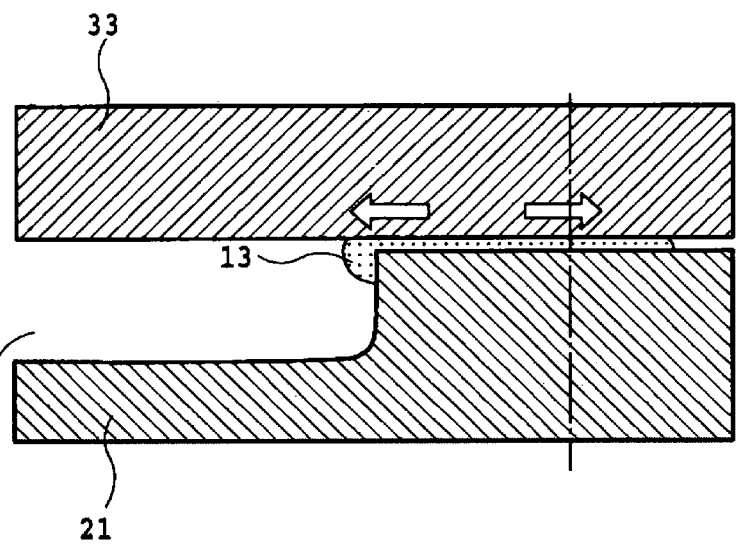
Figure 6B:
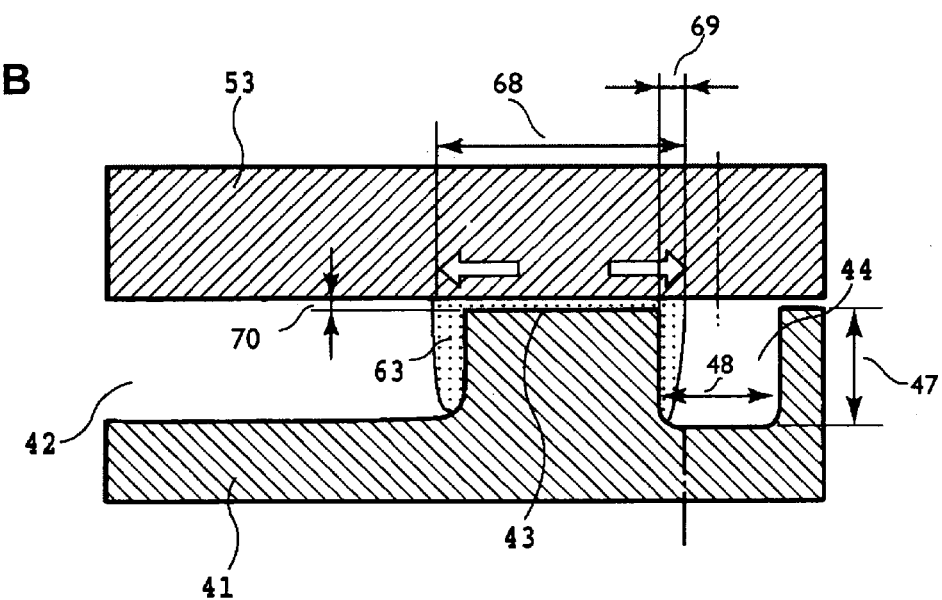

Lamination of the organic EL substrate 53 and the sealing glass substrate 41 can be conducted by a method of combining and pressing the two substrates, a method of combining the two substrates in an environment at a reduced pressure followed by restoring the atmospheric pressure, or a method using the processes in the above two methods together. Combining the substrates as shown in FIG. 5A-5C and squeezing the adhesive, the adhesive 63 extends laterally as shown in FIG. 6B. Then, the excessive adhesive 63 runs off the adhesion region 43 and begins to flow into the adhesive escape groove 44 extending vertically, and is prevented from expanding laterally beyond the adhesive escape groove 44. The adhesive 63 extends laterally inward as well. Here, the adhesive is also prevented from expanding laterally owing to the vertical extension in the recess 42. To prevent the adhesive 63 from lateral extension, the volume of applied adhesive per unit length is controlled to be larger than [a width of the adhesion region×adhesion thickness] and sufficiently smaller than [(a width of the adhesion region×adhesion thickness)+(a width of the adhesive escape groove×a depth of the adhesive escape groove)]. Then, the width of the adhesion region is approximately equal to the adhesion width. Here, the adhesion thickness means the final thickness of the adhesive in the adhesion region 43. With the amount of adhesive application as described above and considering the extension of the adhesive towards the both of the adhesive escape groove 44 and the recess 42, the amount of adhesive that runs off into each of the adhesive escape groove 44 and the recess 42 is less than half the volume (a width 48×a depth 47) of the adhesive escape groove per unit length. Consequently, run off of the adhesive to the bottom surface of the adhesive escape groove 44 can be almost avoided. Here, it is desired that the adhesive does not reach the outer peripheral side-wall of the adhesive escape groove 44. To meet this requirement, it is desired that a width 48 of the adhesive escape groove 44 is larger than half the width 68 of the adhesion region 43 plus tolerance, and the volume of the adhesive application per unit length is more than [the width of the adhesion region×the adhesion thickness] and less than [(the width of the adhesion region×the adhesion thickness)+(half the width of the adhesion region plus tolerance×2×the depth of the adhesive escape groove)× 0.5]. The extension of adhesive can be controlled according to the invention even with a final thickness 70 of the adhesive 63 below 10 μm. The extension of adhesive can of course be controlled more readily with a conventional adhesion thickness of in the range of 10 to 50 μm.

In a case of lamination where a designed target adhesion width is 2 mm, a target adhesion thickness is 6 μm, and an error in the adhesion thickness is ±0.2 mm, a conventional sealing glass substrate with no adhesive escape groove requires control of the volume of adhesive within $0.012±0.0012$ mm$^3$ per unit length (1 mm) even with no distortion in the organic EL substrate 53 and the adhesion glass substrate 41 and with a perfect lamination apparatus without errors. In contrast, a sealing glass substrate 41 in the invention provided with an adhesive escape groove 44 with a depth of 0.5 mm permits a run off volume of 0.1 mm$^3$ per unit length (1 mm), only requiring the control of the volume of adhesive within $0.012+0.1/−0.0012$ mm$^3$ per unit length (1 mm). The allowance in the+side being much larger than the target volume, the target adhesion width can be attained by controlling the volume of adhesive with a little margin even if a certain degree of distortion exists in the organic EL substrate 53 and the adhesion glass substrate 41.

After the combining process as described above, the adhesive 63 is cured by irradiating it with ultraviolet light. The wavelength, intensity, and time of irradiation of the employed ultraviolet light are appropriately determined depending on the type and thickness of the employed adhesive 63. In general, satisfactory curing can be performed using an ultraviolet light lamp having a peak wavelength at 365 nm, with illumination intensity of 100 mW/cm$^2$ and by irradiation for 60 s.

Finally, the sealing glass substrate 41 and the organic EL substrate 53 are cut by means of a scribe method, to form multiple organic EL displays. In the case where some distortion is generated in the organic EL substrate 53 and the sealing glass substrate 41, or in consideration of accuracy of the employed lamination apparatus, the quantity of adhesive must be more than the quantity just necessary to obtain a predetermined adhesion width and thickness. Otherwise, the predetermined adhesion width and thickness would not be attained in some place in the region. In manufacturing multiple displays from a sheet of substrate, it might happen in the worst case that some displays are not sealed at all. On the other hand, if the quantity of adhesive is more than the target value, the adhesive may reach the bottom of the adhesive escape groove 44 in some region. Therefore, the cutting line 52 in the sealing glass substrate 41 is preferably positioned averting from the adhesive that is reached the bottom of the adhesive escape groove 44. Specifically, the cutting line 52 is preferably located outside the inner peripheral side-wall of the adhesive escape groove 44 and within the position at a distance of [(a length equal to the thickness of sealing glass substrate 41)–(a length equal to the depth of adhesive escape groove 44)] from the inner peripheral side-wall of the adhesive escape groove 44. This preferred range has been found empirically by the inventors. It has been clarified that neither problem of external appearance nor functioning occurs when the cutting line 52 is located outside the inner peripheral side-wall of the adhesive escape groove 44 and within the position at 0.3 mm from the inner peripheral side-wall of the adhesive escape groove 44. By locating the cutting line 52 at such a position, the sealing glass substrate 41 can be easily cut; an overhang protrusion with sufficient mechanical strength is formed around the sealing glass substrate 41; and a problem of external appearance that could be produced by this protrusion is avoided.

As for the cutting of organic EL substrate 53, while the width of the adhesive 63 (that is, the adhesion width) is controlled to be approximately the same as the width of the adhesion region 43, small protrusions of the adhesive are formed that must be avoided by the cutting line. Accordingly, the cutting line 51 of the organic EL substrate 53 can be located outside the inner peripheral side-wall of the adhesive escape groove 44 (or outside the lead out terminal region of the organic EL display at an edge adjacent to the terminal region) and at a position not overlapping the adjacent lead out terminal region of the organic EL display. The cutting line is preferably positioned outside the inner peripheral side wall of the adhesive escape groove 44 (or outside the lead out terminal region of the organic EL display at an edge adjacent to the terminal region) distant from the side wall (or the terminal region) by at least 0.3 mm, more preferably at least 0.5 mm, and positioned inside the outer peripheral side-wall of the adhesive escape groove. Since the adhesive is absent in this area owing to the effect of the adhesive escape groove 44, the cutting can be performed satisfactory.

In actual practice, employing the above-described structure and method, an ideal sealing structure has been readily achieved with an adhesion width (a width of the adhesion region) of 2 mm or more and a thickness of the adhesive of about 6 μm, using a general-purpose dispenser and a simple laminating device. If a conventional sealing substrate 21 without an adhesive escape groove 44 is used, the lateral extension of adhesive is difficult to control as shown in FIG. 6A. If an adhesion width of 2 mm and a thickness of adhesive of several μm are tried to obtain, the lateral extension of the adhesive is so great that the peripheral region of the adhesive becomes wavy. To suppress such a situation would require an apparatus to apply the adhesive with very high precision that strictly follows the shape of the surface to be applied and a large scale lamination system that controls the compression force with extreme accuracy. Such an apparatus and system would be very costly.

Figure 8A:
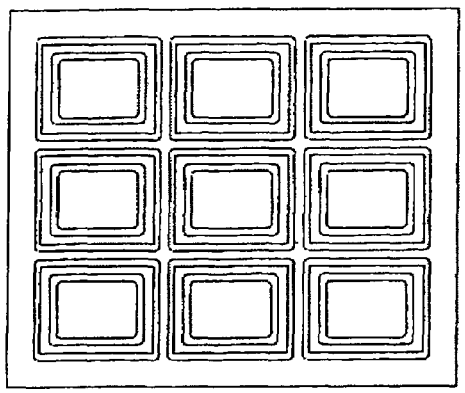
Figure 8C:
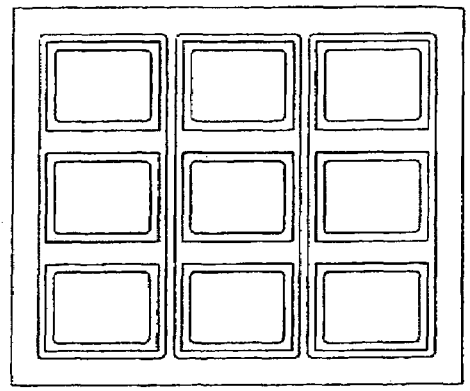
Figure 8B:
Figure 8D:
Figure 8E:
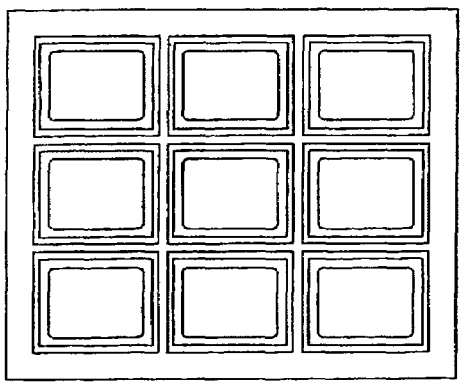
Figure 8G:
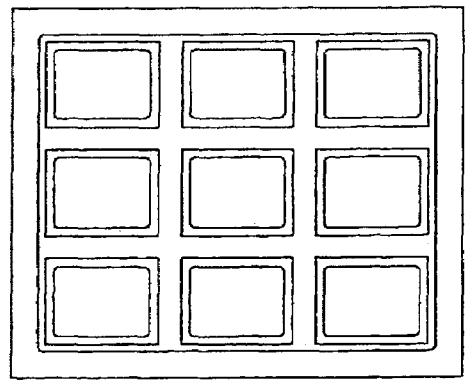
Figure 8F:
Figure 8H:

A sealing glass substrate 41 of the invention may have a structure provided with adhesive escape grooves in both sides of the adhesion region and a recess opposing the organic EL laminate distinct from the adhesive escape groove. The second adhesive escape groove disposed outside the adhesion region is equivalent to the adhesive escape groove 44 in FIGS. 4A-4B and preferably has a similar width and depth. The first adhesive escape groove disposed inside the adhesion region prevents the adhesive from extending towards the organic EL laminate and preferably has a width and depth similar to those of the adhesive escape groove 44 of FIG. 4A-4B. In this type of embodiment, a variation is possible as shown in FIG. 8A-8B in which "(a) no recess is provided at the position opposing the organic EL laminate but grooves are provided in both sides of the adhesion region". In this structure, the first adhesive escape groove disposed inside the adhesion region is effective to prevent the adhesive from extending to the area opposing the organic EL laminate.

To prevent the adhesive 63 from extending laterally in the structure comprising a first adhesive escape groove and a second adhesive escape groove as described above, the volume of adhesive application per unit length is controlled to be larger than [a width of the adhesion region×an adhesion thickness] and sufficiently smaller than [(a width of the adhesion region×an adhesion thickness)+(a width of the second adhesive escape groove×a depth of the second adhesive escape groove)]. Then, the width of the adhesion region is approximately equal to the adhesion width. Here again, it is desired that the adhesive does not reach the bottom of the inner circumference of the second adhesive escape groove disposed outside the adhesion region or the outer peripheral wall of the second adhesive escape groove. To meet this requirement, it is desired that a width of the second adhesive escape groove is larger than half the width of the adhesion region 43 plus tolerance, and the volume of the adhesive application per unit length is more than [the width of the adhesion region×the adhesion thickness] and less than [(the width of the adhesion region×the adhesion thickness)+(half the width of the adhesion region plus tolerance×2×the depth of the second adhesive escape groove)×0.5].

In the above-described structure, when a sealing glass substrate having first and second adhesive escape grooves with a depth of 0.5 mm, for example, is used and the designed target dimensions are an adhesion width of 2 mm, an adhesive thickness of 6 μm, and an error of the adhesion width within±0.2 mm, an amount of extrusion of 0.1 mm$^3$ per unit length (1 mm) is allowed in both sides of the adhesion region. Consequently, it is sufficient for the quantity of the adhesive per unit length (1 mm) to be controlled only in the range of 0.012+0.1/−0.0012 mm$^3$, which means large+side tolerance much greater than the target quantity. Even if the organic EL substrate and the sealing glass substrate have some distortion, the target adhesion width can be attained by controlling the adhesive at a little larger amount.

In the case of an organic EL substrate and a sealing glass substrate involving some degree of distortion, or in consideration of the accuracy of the lamination apparatus, the amount of adhesive is more than the target volume for just obtaining the predetermined adhesion width and thickness. In such a case, the cutting line can be located at a position outside the inner peripheral side-wall of the second adhesive escape groove and at a distance of [(a length equal to the thickness of sealing glass substrate)–(a length equal to the depth of the second adhesive escape groove)] from the inner peripheral side-wall of the second adhesive escape groove. This preferred range has been found empirically by the inventors. It has been generally clarified that no problem on external appearance or functions occurs by locating the cutting line 52 at a position outside the inner peripheral side-wall of the second adhesive escape groove and within 0.3 mm from the inner peripheral side-wall of the second adhesive escape groove. By locating the cutting line 52 at such a position, the sealing glass substrate can be easily cut; an overhang protrusion with sufficient mechanical strength is formed around the sealing glass substrate; and a problem of external appearance that could be produced by this protrusion is avoided.

In a case of a design in which adjacent adhesive escape grooves 44 are desired locating very closely with one another, rather favorable structures can be "(b) an adhesion escape groove is partly joined with an adjacent adhesive escape groove" and "(d) all adhesive escape grooves are joined together". These structures are easier in cutting process although the strength of the sealing glass substrate 41 decreases to a certain degree. In the both structures of (b) in which an adhesion escape groove is partly joined with an adjacent adhesive escape groove and of (d) in which all adhesive escape grooves are joined together, the depth of the adhesive escape groove is preferably in the range as described previously, although not limited to that range. The part of the adhesive escape groove in the structure of (b) that is not joined to the adjacent adhesive escape groove has preferably the same width as previously described. These structures also can be applied to the second adhesive escape groove in the variation of FIG. 8A-8B.

When the decrease of strength of the sealing glass substrate 41 raises no problem, a form can be taken in which "(c) vertexes of outer circumference of an adhesive escape groove are right angle vertexes". In addition, structures that are combinations of these configurations are within the scope of the present invention. In those structures, a width and depth of the adhesive escape groove is preferably within the range as described previously. This structure can be of course applied to the first and second adhesive escape grooves in the variation of FIG. 8A-8B as well.

The above description is directed to the case to manufacture a plurality of displays using an organic EL substrate including a corresponding number of organic EL laminate parts. However, the invention of course also includes the case in which a single display is produces by cutting an organic EL substrate having a single organic EL laminate. Application of the invention to where the substrate is limited to a single organic EL laminate is also effective to control an adhesion width and to decrease a width of "a picture frame".

Figure 7B:
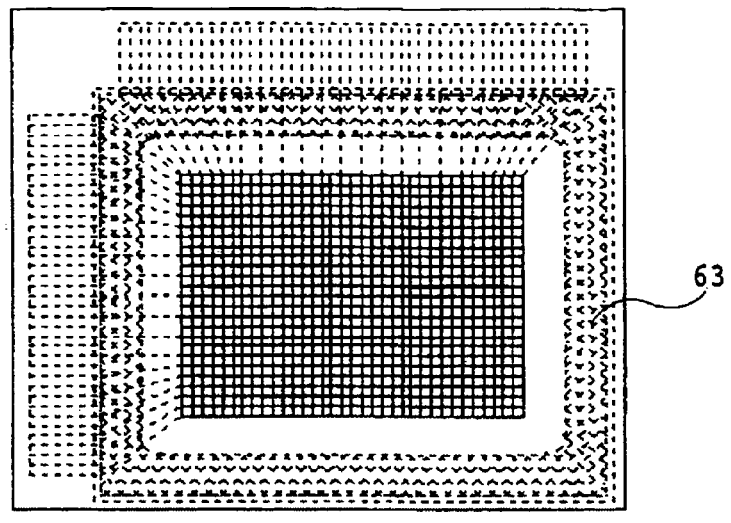
Figure 7A:
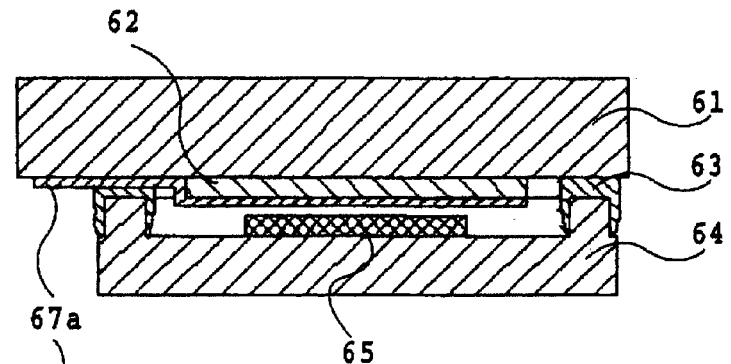
Figure 7C:
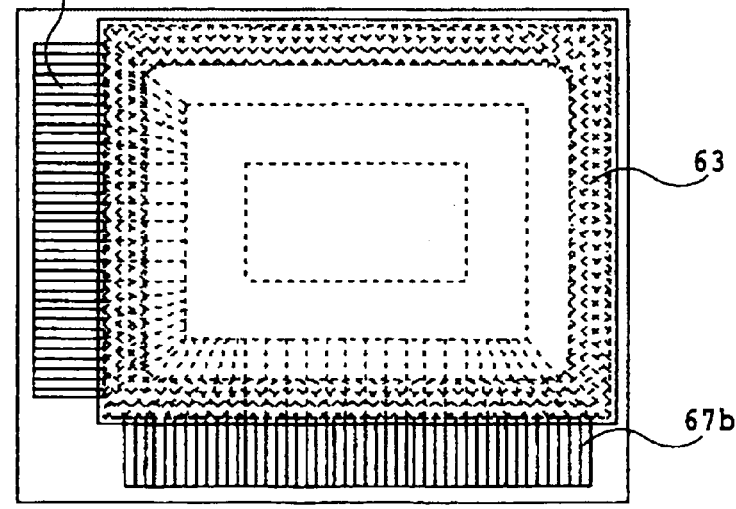

By the laminating and cutting processes as described above, an organic EL display shown in FIGS. 7A-7C can be manufactured. As shown in FIG. 7A, on a transparent substrate 61 (a part of the organic EL substrate 53) formed are an organic EL laminate 62 comprising at least a transparent electrode, an organic EL layer, and a reflection electrode, and a lead out terminal 67a electrically connecting to the reflection electrode of the organic EL laminate 62. This structure is sealed by a sealing glass substrate 64 (a part of the sealing glass substrate 41) having a moisture absorber 65 attached in a recess, and by an adhesive 63. FIG. 7B is a plan view of this structure taken from the side of the transparent substrate 61, and FIG. 7C is a plan view of the structure taken from the side of the sealing glass substrate 64. The lead out terminal 67a is electrically connected to the reflection electrode as described above, and the lead out terminal 67b is electrically connected to the transparent electrode.

The transparent electrode can be formed of a transparent conductive oxide such as $SnO_2$, $In_2O_3$, ITO, IZO, or ZnO:Al. The reflection electrode is preferably formed of a high reflectivity metal, an amorphous alloy, or a microcrystalline alloy. High reflectivity metals include Al, Ag, Mo, W, Ni, and Cr. High reflectivity amorphous alloys include NiP, NiB, CrP, and CrB. High reflectivity microcrystalline alloys include NiAl. For the passive matrix driving, the transparent electrode and the reflection electrode are formed of multiple of stripe-shaped electrode elements, in which the stripes of the transparent electrode extends in the direction crossing, preferably orthogonally, the direction of the stripes of the reflection electrode. The lead out terminals 67a and 67b can be formed by extending the reflection electrode elements and the transparent electrode elements to the peripheral regions of the substrate, or by depositing high conductivity metal connecting to the reflection electrode elements and the transparent electrode elements.

The organic EL layer has a structure that comprises at least an organic light emitting layer, and as necessary, a hole injection layer, a hole transport layer, an electron transport and/or an electron injection layer. These layers can be formed of known materials. To obtain light emission in blue to blue-green color, the organic light emitting layer contains a material selected from fluorescent whitening agents such as benzothiazole, benzoimidazole, and benzoxazole, metal chelate oxonium compounds, styrylbenzene compounds, and aromatic dimethylidine compounds. Preferred materials for the hole injection layer include phthalocyanine compounds such as copper phthalocyanine and triphenylamine derivatives such as m-MTDATA. Preferred materials for the hole transport layer include biphenyl amine derivatives such as TPD and α-NPD. A material for the electron transport layer can be selected from oxadiazole derivatives such as PBD, triazole derivatives, and triazine derivatives. The electron injection layer can be formed of an aluminum quinolinol complex, for example. The electron injection layer can also be formed of an alkali metal, an alkaline earth metal, or an alloy containing these metals, or an alkali metal fluoride compound.

The organic EL laminate 62 can further comprise a color conversion layer and/or a color filter layer as required. The color conversion layer converts the wavelength distribution of light emitted from the organic EL layer. For example, light in blue to blue-green color is converted to light in green color or in red color. The color filter layer selectively transmits light in a specific wavelength range to improve color purity of light from the organic EL layer or from the color conversion layer. The color conversion layer and the color filter layer can be formed of commonly used materials. The color conversion layer and the color filter layer are disposed between the transparent electrode and the transparent substrate 61. In the case provided with the both layers, lamination is preferably conducted in the sequence of a transparent substrate 61/a color filter layer/a color conversion layer/a transparent electrode. In the case in which a color conversion layer and/or a color filter layer is provided, a passivation layer composed of an inorganic oxide or an inorganic nitride (for example, $SiO_2$, $Si_3N_4$, $SiN_xO_y$, and the like) is preferably further provided between those layers and the transparent electrode.

An organic EL display capable of multicolor display can be formed by providing plural types of color conversion layers and/or color filter layers. An organic EL display capable of full color display can be composed by providing color conversion layers and/or color filter layers for red, green and blue colors in an appropriate proportion.

EXAMPLES

A sealing glass substrate was manufactured using a non-alkaline glass substrate having a dimension of 230 mm×200 mm and a thickness of 1.1 mm. A resist film was pasted on the glass substrate. By means of sandblasting, (nine) recesses for accommodating organic EL laminates and adhesive escape grooves each corresponding to each recess were formed. Each recess had a dimension of 56 mm×46 mm and a depth of 0.5 mm. Each adhesive escape groove had a width of 1 mm and a depth of 0.5 mm and was disposed outside the recess with a distance of 2 mm from the recess, that is, an adhesion region 2 mm wide was provided around the recess. The adhesion escape grooves were not connected and were isolated each other.

The thus manufactured sealing glass substrate was cleaned and dried, and then installed in a chamber with both a moisture content and an oxygen content not exceeding 5 ppm. A moisture absorber 0.3 mm thick was attached on the center of each recess of the sealing glass substrate. Ultraviolet light-hardening type epoxy adhesive mixed with 6 μm glass beads was applied on the adhesion region of the sealing glass substrate using a dispenser robot. The volume of applied adhesive was 0.03 mm$^3$ per unit length (1 mm).

The chamber was evacuated to a pressure of −20 kPa (gauge pressure) and the sealing glass substrate having the applied adhesive was combined, adjusting the position, with an organic EL substrate having nine organic EL laminates and fabricated using a non-alkaline glass substrate 0.7 mm thick. The two substrates were laminated with mechanically exerted pressure of 5 kPa. After restoring the atmospheric pressure in the chamber, the epoxy adhesive was cured by irradiation with ultraviolet light at a wavelength around 365 nm and an intensity of 100 W/cm$^2$ for 60 s and subsequently heating at 80° C. for 1 hr. The adhesion thickness was 6 to 10 μm and the width of run off adhesive in the adhesive escape groove was 0.2 mm in one side.

The laminated organic EL substrate and sealing glass substrate were cut by means of a scribe method. The sealing glass substrate was provided with nicks along lines 0.3 mm distant from the inner peripheral side-walls of the adhesive escape grooves. The organic EL substrate was provided with nicks at predetermined positions (0.5 mm outside the lead out terminals in a location corresponding to the lead out terminals of the organic EL display, or 0.5 mm outside the inner peripheral side-wall of the adhesive escape groove in the location without lead out terminals). An automatic breaking apparatus was used to cut into multiple organic EL displays. Any defect such as incomplete cutting or crack was not generated. The hood-shaped protrusion formed on the sealing glass substrate had a thickness of 0.6 mm and a width of 0.3 mm, exhibiting sufficient mechanical strength and involving no problem of external appearance.

What is claimed is:

1. A method of manufacturing an organic EL display comprising the steps of:
   providing an organic EL substrate that comprises one or more organic EL laminates;
   providing a sealing glass substrate, the sealing glass substrate being formed of a glass plate and comprising recesses each opposing respective one of the one or more organic EL laminates, adhesion regions each surrounding a respective one of the recesses, and adhesion escape grooves each surrounding a respective one of the adhesion regions;
   applying an adhesive on the adhesion regions of the sealing glass substrate;
   laminating the organic EL substrate and the sealing glass substrate;
   cutting the sealing glass substrate at a position outside an inner periphery of the adhesive escape groove and within a distance equal to a thickness of the sealing glass substrate minus a depth of the adhesive escape grooves from the inner periphery of the adhesive escape grooves; and
   cutting the organic EL substrate at a position outside the inner periphery of the adhesive escape groove.

2. The method of manufacturing an organic EL display according to claim 1, wherein the recesses and the adhesion escape grooves of the sealing glass substrate have a substantially equal depth.

3. The method of manufacturing an organic EL display according to claim 1, wherein vertexes of the inner periphery of the adhesive escape grooves are right angle vertexes, and vertexes of an outer periphery of the adhesive escape grooves are rounded.

4. The method of manufacturing an organic EL display according to claim 1, wherein a width of the adhesion regions is in a range of 1 to 5 mm and the depth of the adhesive escape grooves is in a range of 100 to 600 μm.

5. The method of manufacturing an organic EL display according to claim 1, wherein a width of the adhesive escape grooves is in a range of 0.5 to 2 mm.

6. The method of manufacturing an organic EL display according to claim 1, wherein an applied volume of the adhesive per unit application length is at least a product of a width of the adhesion regions and an adhesion thickness and at most a product of a width of the adhesion regions and an adhesion thickness plus a product of a width of the adhesive escape grooves and a depth of the adhesive escape grooves.

7. The method of manufacturing an organic EL display according to claim 1, wherein an adhesion thickness is in a range of 1 to 30 μm.

8. A method of manufacturing an organic EL display comprising steps of:
   providing an organic EL substrate that comprises one or more organic EL laminates;
   providing a sealing glass substrate, the sealing glass substrate being formed of a glass plate and comprising adhesion regions each disposed corresponding to a periphery of a respective one of the one or more organic EL laminates, first adhesion escape grooves each disposed inside a respective one of the adhesion regions, and second adhesion escape grooves each disposed outside a respective one of the adhesion regions;
   applying an adhesive on the adhesion regions of the sealing glass substrate;
   laminating the organic EL substrate and the sealing glass substrate;
   cutting the sealing glass substrate for organic EL at a position outside an inner periphery of the second adhesive escape grooves and within a distance equal to a thickness of the sealing glass substrate minus a depth of the adhesive escape grooves from the inner periphery of the second adhesive escape grooves; and
   cutting the organic EL substrate at a position outside the inner periphery of the second adhesive escape grooves.

9. The method of manufacturing an organic EL display according to claim 8, wherein vertexes of an inner periphery of the first adhesive escape grooves and vertexes of the inner periphery of the second adhesive escape grooves are right angle vertexes, and vertexes of an outer periphery of the first and second adhesive escape grooves are rounded.

10. The method of manufacturing an organic EL display according to claim 8, wherein a width of the adhesion regions is in a range of 1 to 5 mm and the depth of the adhesive escape grooves is in a range of 100 to 600 µm.

11. The method of manufacturing an organic EL display according to claim 8, wherein a width of the first and second adhesive escape grooves is in a range of 0.5 to 2 mm.

12. The method of manufacturing an organic EL display according to claim 8, wherein the sealing glass substrate further comprises recesses each opposing a respective one of the one or more organic EL laminates and being distinct from the first adhesive escape grooves.

13. The method of manufacturing an organic EL display according to claim 8, wherein an applied volume of the adhesive per unit application length is at least a product of a width of the adhesion regions and an adhesion thickness and at most the product of the width of the adhesion regions and the adhesion thickness plus a product of a width of the second adhesive escape grooves and the depth of the adhesive escape grooves.

14. The method of manufacturing an organic EL display according to claim 8, wherein an adhesion thickness is in a range of 1 to 30 µm.

* * * * *